United States Patent
Hofmann (10) Patent No.: US 7,132,897 B2
(45) Date of Patent: Nov. 7, 2006

(54) METHOD AND CIRCUIT FOR PRODUCING A CONTROL VOLTAGE FOR A VCO

(75) Inventor: Karl Hofmann, Ulm (DE)

(73) Assignee: Atmel Germany GmbH, Heilbronn (DE)

(*) Notice: Subject to any disclaimer, the term of this patent is extended or adjusted under 35 U.S.C. 154(b) by 0 days.

(21) Appl. No.: 10/988,316

(22) Filed: Nov. 12, 2004

(65) Prior Publication Data

US 2005/0104671 A1     May 19, 2005

(30) Foreign Application Priority Data

Nov. 14, 2003   (DE)   ................. 103 54 522

(51) Int. Cl.
*H03L 7/06*       (2006.01)
(52) U.S. Cl. .................. 331/16; 331/17; 327/156
(58) Field of Classification Search ............ 331/16, 331/17; 327/147, 156
See application file for complete search history.

(56) References Cited

U.S. PATENT DOCUMENTS

| | | | |
|---|---|---|---|
| 6,317,006 B1 * | 11/2001 | Welland et al. | 331/25 |
| 6,566,966 B1 | 5/2003 | Bellaouar et al. | |
| 6,710,664 B1 * | 3/2004 | Humphreys et al. | 331/11 |

2003/0048139 A1   3/2003 Chien et al.

FOREIGN PATENT DOCUMENTS

EP           0993122 A1       4/2000

OTHER PUBLICATIONS

Wilson et al., A CMOS Self-Calibrating Frequency Synthesizer, IEEE Journal of Solid-State Circuits, vol. 35, No. 10, Oct. 2000, pp. 1437-1444.

* cited by examiner

*Primary Examiner*—Benny Lee
*Assistant Examiner*—James Goodley
(74) *Attorney, Agent, or Firm*—W. F. Fasse; W. G. Fasse (57) ABSTRACT

The control voltage for a VCO (voltage controlled oscillator) is produced in a phase locked loop which in turn is controlled by a computer (40) including an integrated analog circuit (42). First the oscillator control voltage is set to a predetermined value. Then, voltage varying steps are performed. For performing these steps, the circuit includes a main frequency divider and a reference frequency divider both functioning as counters. The beginnings of the counting of each divider are synchronized with each other. The oscillator control voltage is increased by a predetermined voltage difference or increment when the reference divider completes its counting period prior to the main divider completing its counting. The oscillator control voltage is decreased by a predetermined voltage difference or decrement when the main divider finishes its counting period prior to the reference divider finishing its count.

20 Claims, 5 Drawing Sheets

METHOD AND CIRCUIT FOR PRODUCING A CONTROL VOLTAGE FOR A VCO

PRIORITY CLAIM

This application is based on and claims the priority under 35 U.S.C. §119 of German Patent Application 103 54 522.0, filed on Nov. 14, 2003, the entire disclosure of which is incorporated herein by reference.

FIELD OF THE INVENTION

The invention relates to a method and circuit for producing a control voltage for a voltage controlled oscillator (VCO). Starting with a preset control voltage, a phase locked loop is used to vary the preset control voltage. The circuit arrangement is capable of presetting the initial control voltage.

BACKGROUND INFORMATION

European Patent Publication EP 993,122 describes a method and circuit as mentioned above. So-called phase locked loops (PLL), are used for generating, with the aid of frequency synthesizers, defined frequency signals for frequency mixers. In connection with transceiver systems it is necessary that the rated frequency of the oscillator output signal varies significantly within a short period of time. For example, in connection with the global packet radio services (GPRS) it is required that a frequency jump of about 150 MHz takes place within about 150 µs to 200 µs with an average frequency of about 2 to 2.4 GHz. The precision with which the rated frequency is supposed to be adjusted within this time, also referred to as settling time, is within the range of a few kHz.

In order to reduce the settling time, the above mentioned European Patent Publication 993,122 teaches to provide a voltage which corresponds to the rated value of the output voltage of the loop filter in the phase locked loop following settling. For this purpose a rated control voltage value is calculated with the aid of a digital-to-analog converter which uses programmed counter output counts of the phase locked loop. These counter output counts provide numbers of periods of a frequency divider input signal at which the frequency divider varies its output signal level. That suggestion requires an additional memory in which calibrated data for the voltage controlled oscillator are stored in order to compensate for manufacturing tolerances of the oscillator. These data are also required to operate the phase locked loop with voltage controlled oscillators. Such oscillators have different voltage-frequency characteristics. In this context it is further required, when the phase locked loop is installed in an apparatus, to perform a programming cycle for describing the memory. Additionally, it is necessary to provide a reference voltage or a reference current for the digital-to-analog converter. This reference voltage or current must be stabilized relative to temperature changes and relative to changes in the supply voltage. Particularly, the generation of stabilized reference values is difficult in connection with realizing the phase locked loop in accordance with complementary metal oxide semiconductor technologies (CMOS).

However, it is basically desirable that a circuit arrangement for producing a control voltage for a voltage controlled oscillator can be integrated into a CMOS-circuit. It is also desirable to realize such a CMOS circuit without an expensive digital-to-analog converter and without the above mentioned memory. Such a circuit realized as a CMOS circuit is independent of a temperature drift and of a supply voltage drift. Another advantage is seen that no calibration of the voltage controlled oscillator is required.

OBJECTS OF THE INVENTION

In view of the foregoing it is the aim of the invention to achieve the following objects singly or in combination:

to substantially shorten the above mentioned settling time when a frequency change or a starting of the phase locked loop is required in a circuit arrangement for producing a control voltage for a voltage controlled oscillator;

to make such a circuit independent of any temperature changes and independent of any supply voltage changes while simultaneously avoiding calibrations of the voltage controlled oscillator;

to avoid the above mentioned digital-to-analog converter as well as the memory that was required heretofore; and to realize the present circuit arrangement as a CMOS-circuit.

The invention further aims to avoid or overcome the disadvantages of the prior art, and to achieve additional advantages, as apparent from the present specification. The attainment of these objects is, however, not a required limitation of the claimed invention.

SUMMARY OF THE INVENTION

The above objects have been achieved according to the invention by a method in which the following steps are performed after setting the starting oscillator control voltage to a rated starting value; synchronizing the beginnings of counting periods of a main frequency divider and of a reference frequency divider, changing by incrementing or decrementing the control voltage by predetermined increments or decrements, also referred to as step widths or voltage differences when the reference frequency divider completes its counting sequence or period faster than or prior to the main frequency divider completing its own counting sequence or period and further changing the control voltage in predetermined decrements or increments when the main frequency divider completes its counting period or sequence prior to the completing of the counting sequence by the reference frequency divider. The direction of change namely increasing or decreasing, depends on the characteristic of the voltage controlled oscillator. In case the voltage controlled oscillator has a negative characteristic the control voltage is first decreased and then increased. On the other hand in connection with a voltage controlled oscillator having a positive characteristic, the control voltage is first increased and then decreased. An oscillator has a positive characteristic when the control voltage is proportional to the oscillator frequency. An oscillator has a negative characteristic when the control voltage is inversely proportional to the oscillator frequency.

The circuit arrangement according to the invention achieves the above objects by the combination of the following features: an input for setting a rated starting oscillator control voltage, a main frequency divider and a reference frequency divider, a synchronizer for synchronizing the beginnings of counting sequences or periods of the two frequency dividers, a first voltage varying circuit for increasing or decreasing the control voltage by a predetermined voltage difference or step width when the reference frequency divider finishes its counting sequence or period faster than the main frequency divider and a second voltage varying circuit for decreasing or increasing the control voltage by a predetermined difference or step width when the main frequency divider finishes its counting sequence or period faster than the reference frequency divider completes its own counting period or sequence.

The circuit arrangement according to the invention can be integrated into a CMOS-circuit and hence can be realized without any expensive and involved digital-to-analog converter and without any memory for frequency dependent base values or data. When a voltage controlled oscillator is to be controlled as taught by the invention, is manufactured, it is not necessary to calibrate the oscillator because the phase locked loop itself provides the correct control voltage in an iterative process and in a closed loop. Any temperature drift and/or any variations in the supply voltage are automatically taken into account by the present circuit arrangement and the present method in the adjustment of the oscillator control voltage, whereby altogether a short settling time is achieved when a frequency is changed or when the phase locked loop is started.

For performing the present method it is preferred that the counting steps are repeated, preferably up to five times, and that the predetermined step width or voltage difference is reduced in decrements for each counting repetition. This feature assures that the oscillator control voltage approximates the voltage that leads to the desired frequency in successive steps with an increasing accuracy, whereby altogether a rapid settling time on the desired frequency is assured.

Another preferred feature of the invention is setting the starting value of the oscillator control voltage to one half or 50% of the supply voltage of the oscillator. This supply voltage is also the supply voltage for the loop filter in the phase locked loop. This initially symmetric division of the supply voltage has the advantage that the sign (+,−) of a deviation up or down from a starting value does not have an influence on the settling time of the final adjusted control voltage. This selection of the initial control voltage value presents a compromise that permits to quickly adjust all possible initially unknown control voltages for achieving desired oscillator frequencies.

It is further a preferred feature of the invention to calculate during a counting period and on the basis of the actual or current voltage control value, two new control voltage values, one of which is larger than the actual control voltage value while the other is smaller than the actual control voltage value. The respective voltage differences of these new values relative to the actual or current control voltage value, define the step widths that is a voltage increment or voltage decrement, respectively. This feature of the invention has the advantage that both possible control voltage values for a following iteration step n+1 are provided already during a current iteration step so that these voltage values are directly available at the end of the current iteration step n. As a result, the iteration step n+1 can begin immediately without any time delay when the decision whether an increase or decrease of the control voltage is necessary for the respective iteration step n+1, is available. This feature also contributes to a rapid settling time of the phase locked loop. In this connection it is preferred that the calculation of new control voltage values also take into account at least one past voltage value used prior to the actual current value. This feature reduces the number of the required iteration steps as compared to trying several alternative base values that are independent of one another. This feature is also advantageous for achieving a rapid settling time.

As mentioned above, it is preferred to perform up to five iteration steps amounting to a total of six iteration steps prior to switching over to a steady closed loop control. It has been found that this limit of iteration steps in practicing the invention with an integrated CMOS-circuit, leads to a voltage resolution of about 50 mV. This limit for an iterative approximation to the correct control voltage is considered to be reasonable in connection with circuits realized with CMOS technology. Any remainder deviation from the correct control voltage can then be reduced without any problems within the customary function of a phase locked loop. In this connection the voltage resolution is the voltage increment or decrement or step width of the last iteration step.

In performing the present method it is further preferred that the switch-over to a steady closed loop control is performed when at least one spacing or time difference between an end of a reference divider counting period and an end of a main divider counting period is smaller than a predetermined threshold value. This feature makes it possible to stop the iteration process when a satisfactory approximation to the correct oscillator control voltage has been achieved already with a few iteration steps. These steps can be stopped when a phase/frequency detector or a computer have ascertained that frequency differences of a counting period or preferably two sequential counting periods, are lower than a given or rated threshold value.

The present circuit arrangement is preferably so constructed that the voltage varying steps are performed repeatedly and the predetermined step width or the predetermined voltage difference per varying step is reduced for each repetition. Further, it is preferred that the present circuit arrangement additionally or alternatively provides the starting control voltage value as one half of the supply voltage of the voltage controlled oscillator. It is also preferred that additionally or in the alternative the present circuit arrangement has a computer which calculates during a counting period from the actual current control voltage value a new such value at least once above the actual control value and once below the actual control value. Additionally or alternatively, the present circuit arrangement predetermines the control voltage value in up to five iteration steps performed successively and stepwise prior to switching over to a steady closed loop control. Additionally or in the alternative, the present circuit switches over to a steady closed loop control when at least one time spacing between the completion of one counting period by the reference frequency divider and a completion of a counting period by the main frequency divider is smaller than a predetermined threshold value. The just outlined characteristics of the present circuit arrangement or arrangements have the same advantages as described above in connection with the features of the present method.

According to the invention the present circuit arrangement more specifically its control circuit further comprises an integrated analog circuit including switchable capacitors which function as control elements and which are switched or operated by a sequencing control.

Integrated circuits are particularly suitable for a cost effective production of high piece numbers of the present circuit. Another advantage of integrated circuits is their small space requirement and their low power input requirement. It is particularly advantageous that the circuit arrangements according to the invention are amenable to being produced as integrated circuits. Thus, these circuit embodiments are particularly suitable for mobile applications with limited installation space and limited available power, which is for example typical in a mobile telephone system.

In a preferred embodiment of the present circuit arrangement the switchable capacitors are controlled by CMOS transistors functioning as switches. Such a construction has the known advantages of the tested and proven CMOS technology as applied to the circuit of the invention.

The control computer or processing unit that is part of the circuit arrangement according to the invention is preferably so constructed that the computer can control at least one of the above mentioned methods and/or method embodiments. The cooperation of a computer control with an analog circuit, the function of which is controlled by control signals from the computer, combines the advantage of digital and analog features while simultaneously avoiding the respective disadvantages. For example, according to the invention an analog-to-digital converter is not necessary for practicing the present invention.

It is preferred that the analog circuit as used according to the invention comprises circuit nodes coupled to the respective capacitors, wherein at least one node capacitor pair stores one actual voltage control value VC(t) of the oscillator control voltage, wherein at least one further node capacitor pair stores a past oscillator control voltage VC(t−1), and wherein at least two node capacitor pairs store two possible future oscillator control voltage values (VC(t+1)) of the oscillator control voltage. Such an analog circuit has the advantage that the informations required for producing new control values are stored by electric charges within the analog circuit itself. Thus, an analog-to-digital converting for processing such informations in the computer and a subsequent digital-to-analog conversion for outputting the calculation results are not necessary. Such an analog circuit corresponds to an analog realization of the functions of a digital-to-analog converter and for realizing partial functions of a computer.

According to a further preferred embodiment of the present invention two switchable capacitor (SC) amplifiers are provided, one of these amplifiers has an inverting characteristic and produces a possible, future oscillator control voltage (VC(t+1)) while the other SC amplifier has a non-inverting characteristic and produces a further possible, future oscillator control voltage (VC(t+1)). With these two amplifiers it is possible to provide two future possible oscillator control voltages in parallel already during a current counting period or sequence so that these future values are immediately available for selection for the next iterating step. In this connection it is preferred that the respective SC-amplifier produces the corresponding future oscillator control voltage VC(t+1) as a function of a past oscillator control voltage value VC(t−1) and on the basis of an actual, current control voltage value VC(t). In this embodiment of the present circuit arrangement it is possible to make the voltage increments and the voltage decrements or voltage differences dependent on the spacing of the values VC(t) and VC(t−1). In this manner it is possible to achieve an increasing resolution and precision of the control value determination as the number of iteration steps increases.

According to the invention the inverting SC amplifier forms the possible future oscillator control voltage VC(t+1) according to the following equation:

$$VC(t+1)=VC(t)+((VC(t)-VC(t-1))/a \qquad \text{(Equation I)}$$

The non-inverting SC amplifier produces the future possible oscillator control voltage VC(t+1) according to the following equation:

$$VC(t+1)=VC(t)-((VC(t)-VC(t-1))/a \qquad \text{(Equation II)}$$

In the foregoing equations the divisor "a" determines the voltage difference, either an increment or a decrement, of the oscillator control voltage and this divisor "a" itself is determined by the ratio between two respective capacities. This feature of the invention has the additional advantage that the voltage difference or step width in the form of a voltage increment or a voltage decrement for achieving a further improved resolution, can be obtained by simple circuit measures, namely by the selection of two capacitors.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
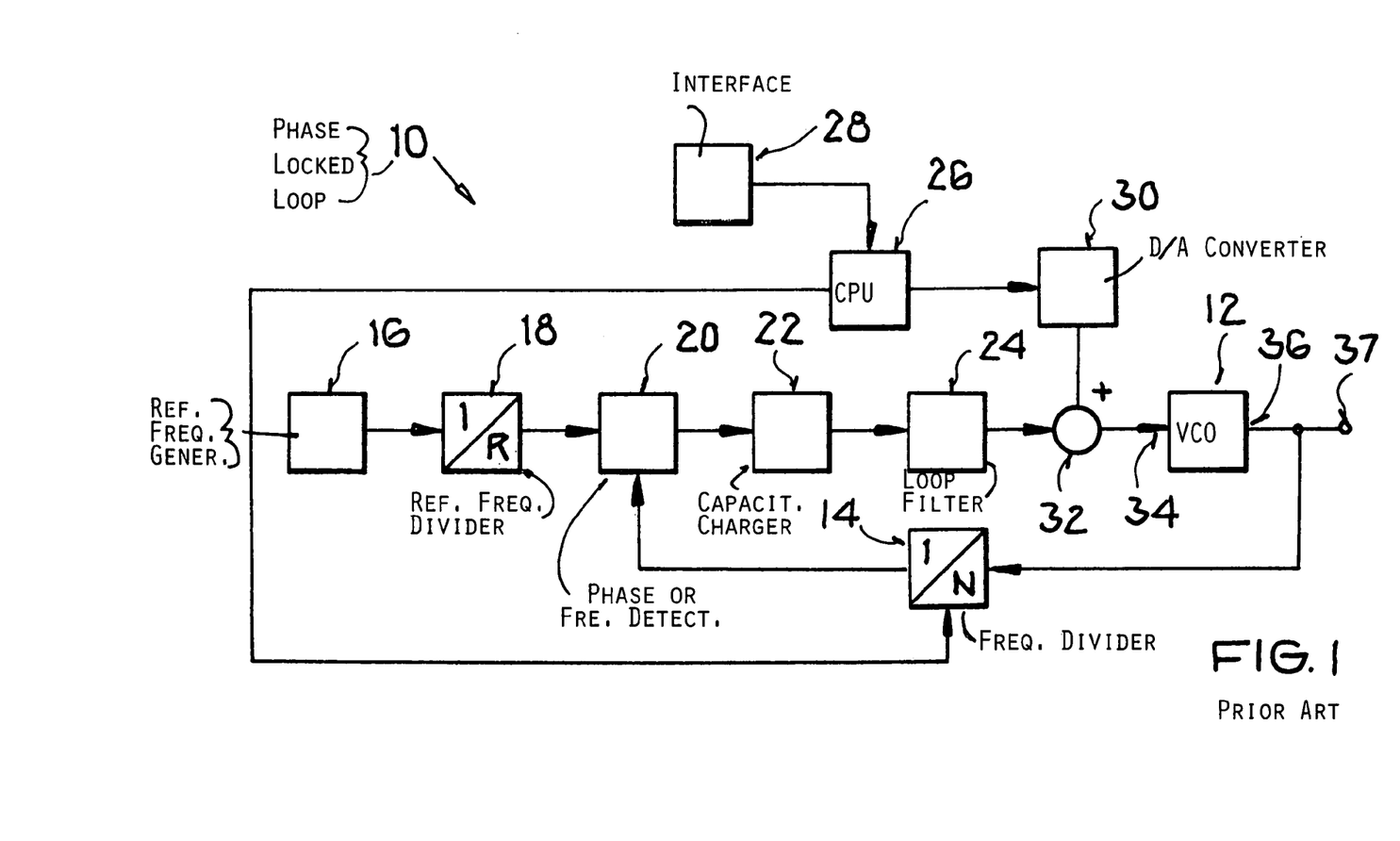
FIG. 1 illustrates a conventional phase locked loop comprising a digital-to-analog converter for setting a base or initial value of the oscillator control voltage.

FIG. 1 shows a conventional phase locked loop 10 that produces a control voltage for a voltage controlled oscillator 12. The phase locked loop includes a programmable main frequency divider 14, a reference frequency generator 16, a reference frequency divider 18, a phase or frequency detector 20, a capacitor charging pump 22, a loop filter 24, and a control 26. The control 26 reacts to input signals supplied through an interface 28. The control 26 provides, for example, a control signal to the main frequency divider 14 and an input signal to a digital-to-analog converter 30 which supplies through a logic circuit component 32, a control voltage to an input 34 of the voltage controlled oscillator 12. The oscillator 12 has an output 36 connected to an input of the main frequency divider 14 and to a circuit node 37 which supplies the oscillator output signal to a mixing stage of a transmitter and/or a receiver.

The phase locked loop 10 functions basically as follows. The reference frequency of, for example 13 MHz, generated by the reference frequency generator 16 is divided by the reference frequency divider 18 by a divisor R. If the divisor R is, for example, 65 it means that the divider 18 respectively counts 65 rising or falling flanks of the input signal before the output signal of the divider 18 provides an output signal with a corresponding flank. For the given example of R=65, the output signal at the output of the reference divider 18 provides a frequency of 200 kHz. For example, when used in a GSM-system, this frequency defines the channel raster as predetermined by the system. The voltage controlled oscillator 12 generates a second signal with a frequency of, for example, about 2 GHz. This signal frequency is divided by the main frequency divider 14 by a divisor N. This divided signal is compared in the phase frequency detector 20 with the above mentioned divided reference signal. The frequency of the divided signal from the oscillator 12 is so controlled in closed loop fashion, through the closed loop control circuit of the phase locked loop 10 with its charging pump 22 and a loop filter 22, that the two input signals to the phase frequency detector 20 have the same frequency and a fixed phase relationship. At least the main frequency divider 14 is programmable by the control 26 so that the frequency of the oscillator 12 can be adjusted by varying the divisor N, for example in 200 kHz steps or increments or decrements. Adjusting or varying the divisor N leads through the phase locked loop 10 to a new frequency output at the oscillator 12 and to the settling of the control voltage at the input of the oscillator 12. In order to shorten the settling time, the control 26 of the conventional phase locked loop 10 provides a data word to the digital-to-analog converter 30 which produces from that data word an analog base value or a correction value. This correction value is supplied through the circuit node or logic junction 32 connected between the loop filter 24 and the oscillator 12, to the phase locked loop 10.

Figure 2:
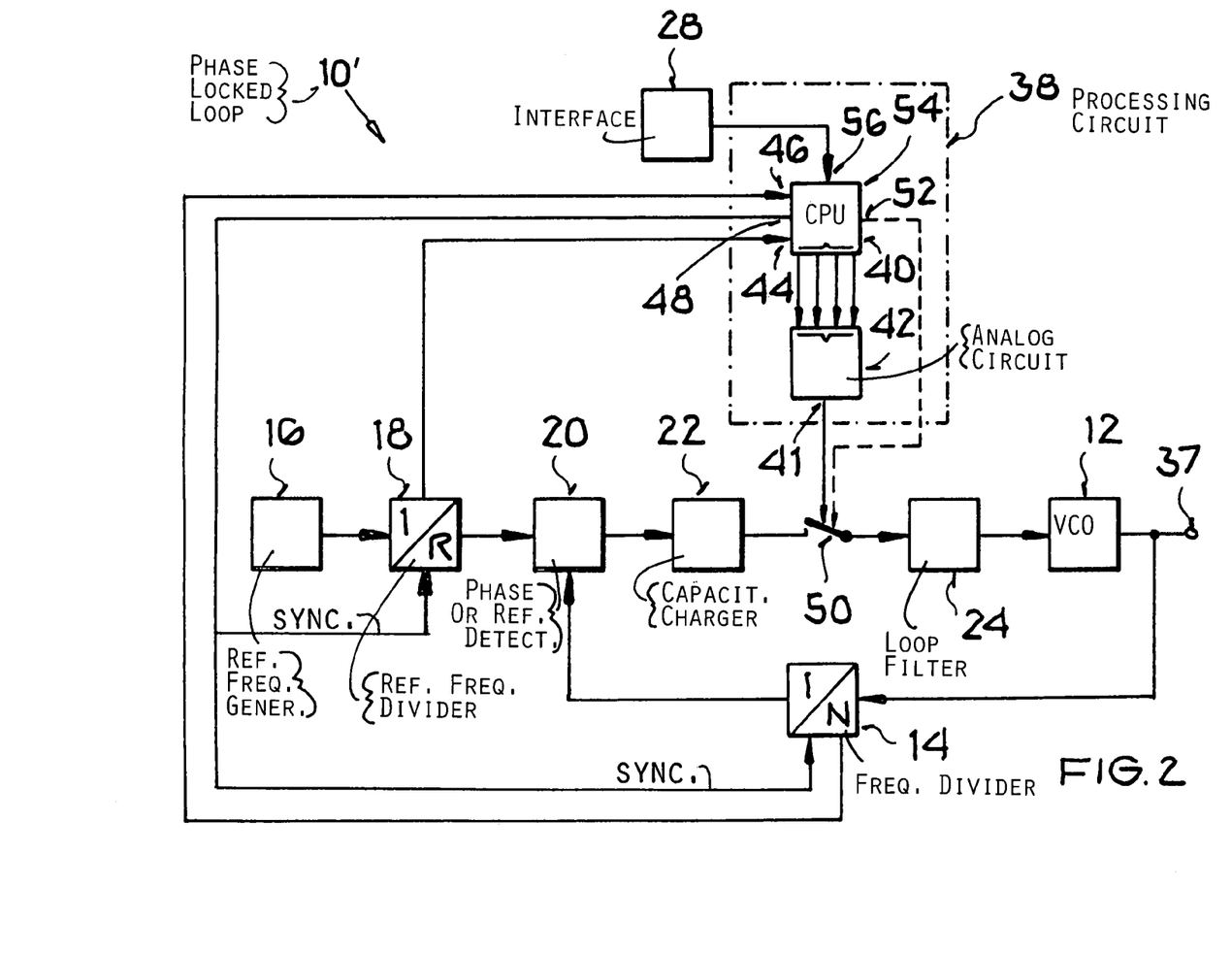
FIG. 2 shows an embodiment according to the invention of a circuit arrangement that uses instead of a digital-to-analog converter and related circuitry a control circuit including an analog circuit for controlling the operation of a phase locked loop to produce the control voltage for a voltage controlled oscillator.

According to the invention and as shown in FIG. 2, a conventional phase locked loop has been modified in its topology. The present phase locked loop 10' of FIG. 2 comprises a circuit 38 which includes a computer 40, such as a central processing unit, and an analog circuit 42. The computer 40 performs several functions. One of these functions is the synchronization of the beginnings of the counting periods of the main frequency divider 14 and of the reference frequency divider 18. The computer 40 comprises a respective synchronizing device and has an input 44 to receive a count signal from the reference frequency divider 18 and a further input 46 for receiving a count signal from the main frequency divider 14. The computer 40 has an output 48 leading to both dividers 14 and 18 for their synchronization, for example in such a way that the counting procedure of the main frequency divider 14 is triggered to start when the reference frequency divider 18 begins its count.

The analog circuit 42 comprises a circuit component for setting a starting value for the oscillator control voltage and further components for increasing the control voltage by a predetermined increment or voltage step width when the reference divider completes its counting period faster than the main frequency divider completes its own counting period. These further circuit components also reduce the control voltage by a predetermined decrement when the main frequency divider completes its counting period faster than the reference divider completes its counting period.

The operation of the above described circuit produces a control voltage for the oscillator 12 in an iterative stepping procedure, whereby it is assumed that the phase locked loop 10 comprises a phase/frequency detector 20 which operates as a frequency comparator. For this purpose the beginnings of the counting periods or sequences of the two dividers 14 and 18 of the phase locked loop 10 are synchronized with each other and triggered to start simultaneously. Each counting period or sequence starts with a determined flank of the respective signal. The points of time for triggering a counting period in both frequency dividers 14 and 18 are thus, as a rule, not identical, however, these points of time are spaced from each other maximally only by a time period or duration of the signal having the higher frequency. This signal with the higher frequency is, as a rule, the signal output from the oscillator 12. Since the number of typical counting periods or sequences of the respective allocated main divider 14, is about 160, the uncertainty of this example is maximally ⅟₁₆₀. Such a small uncertainty is tolerable.

The computer 40 ascertains which of the two frequency dividers 14 or 18 completed its count first. In an alternative embodiment, the phase or frequency detector 20 can ascertain which of the two frequency dividers 14 or 18 finished its counting period first. In order to be able to perform this function the phase/frequency detector 20 would have to be connected through a control conductor with an input of the computer 40. In case the main frequency divider 14 finishes its counting period first, that is prior to the reference frequency counter 18 finishing its counting period, the frequency of the oscillator is too high. The computer 40 then provides a control signal that causes the analog circuit 42 to reduce the oscillator control voltage by one voltage decrement or step width. If, however, the reference frequency divider 18 has completed its counting period prior to the completion of the counting period by the main frequency divider 14, the computer 40 provides a control signal that causes a stepwise increase of the control voltage.

For example, the oscillator control voltage is supplied through an output 41 of the analog circuit 42 to the loop filter 24 through a switch 50 as an alternative to the output signal from the charging pump 22 or from the phase or frequency detector 20. The switch 50 is operated by the computer 40 through the computer output 52. The computer 40 also controls the sequence or steps of the method according to the invention and of its various embodiments through the outputs 54 shown in more detail in FIG. 3. The computer 40 also has an input port 56 connected to the interface 28.

In operation the circuit 38 according to the invention initially sets the oscillator control voltage first to a predetermined value and then synchronizes the beginnings of counting periods in the main frequency divider 14 and in the reference frequency divider 18. In the following operation the control voltage is incremented or decremented by one respectively predetermined voltage increment or voltage decrement, also referred to as voltage step width, depending on the counting periods of the frequency dividers 14 and 18.

Figure 3:
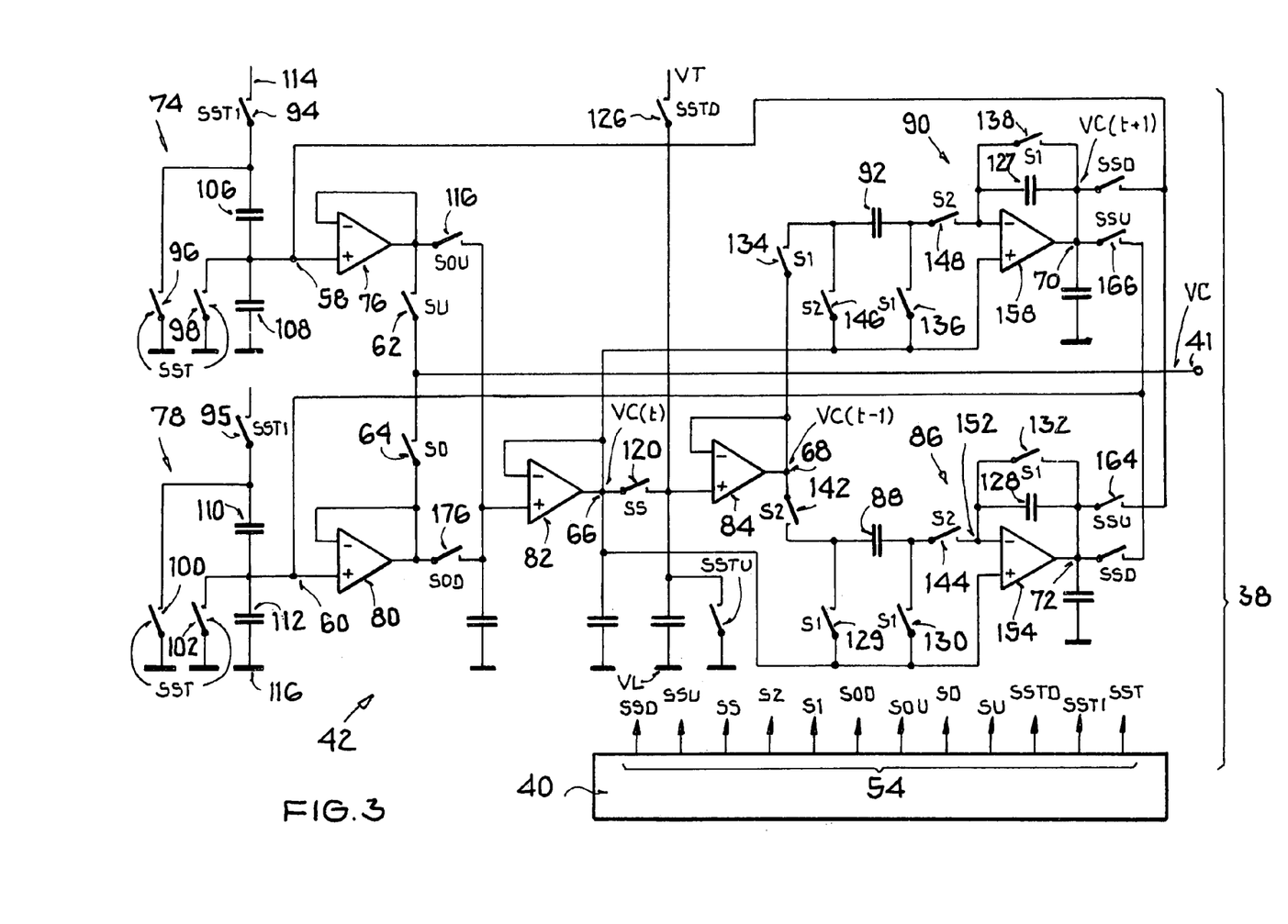
FIG. 3 shows further details of the control circuit of the invention for controlling the operation of the phase locked loop.

FIG. 3 illustrates in more detail an example embodiment of the circuit 38 according to the invention. As mentioned above, the circuit 38 comprises the computer 40 and the analog circuit 42 connected to the computer 40. FIG. 3 also shows the computer 40 with its plurality of outputs 54 designated as SST, SST1, SSTD, SU, SD, SOU, SOD, S1, S2, SS, SSU and SSD. The designations of the computer outputs 54 correspond to the designations of the respective pulse or pulse train shown in FIG. 4. For clearness sake, the conductors between the computer outputs 54 and the various switches are not shown in FIG. 3, however, the designations of the computer output terminals 54 are repeated at the respective switch which makes it clear which switch is controlled by which control output 54 of the computer 40. The output designations at the outputs 54 relate to the control signals that operate the respective switches in the analog circuit.

A control voltage VC for the oscillator 12 is made available at the output or circuit node 41 of the analog circuit 42 shown in FIG. 3. The analog circuit 42 stores an upper control voltage value VCU at a circuit node 58 and a lower control voltage value VCD at a circuit node 60. As required, one or the other of the upper or lower control voltage values VCU or VCD is supplied through the switches 62, 64 to the circuit output or node 41. The output voltage of the analog circuit 42 is thus actualized. The respective actual or current control voltage value is stored at a circuit node 66. A prior or past control voltage value is available at the circuit node 68. Possible future control voltage values are calculated and stored at further circuit nodes 70 and 72.

In order to make available and actualize the voltages that are present at the nodes 41, 58, 60, 66, 68, 70 and 72, the analog circuit 42 comprises a first voltage divider 74 including a voltage follower or amplifier 76. The analog circuits 42 comprises a second voltage divider 78 with a second voltage follower or amplifier 80 as well as a third voltage follower or amplifier 82 and a fourth voltage follower or amplifier 84. The analog circuit 42 further comprises an inverting switchable capacitor amplifier 86 also referred to as SC-amplifier with a switchable capacitor 88. The analog circuit 42 further includes a non-inverting SC-amplifier 90 with a switchable capacitor 92 and further capacitors and respective switches.

Figure 4:
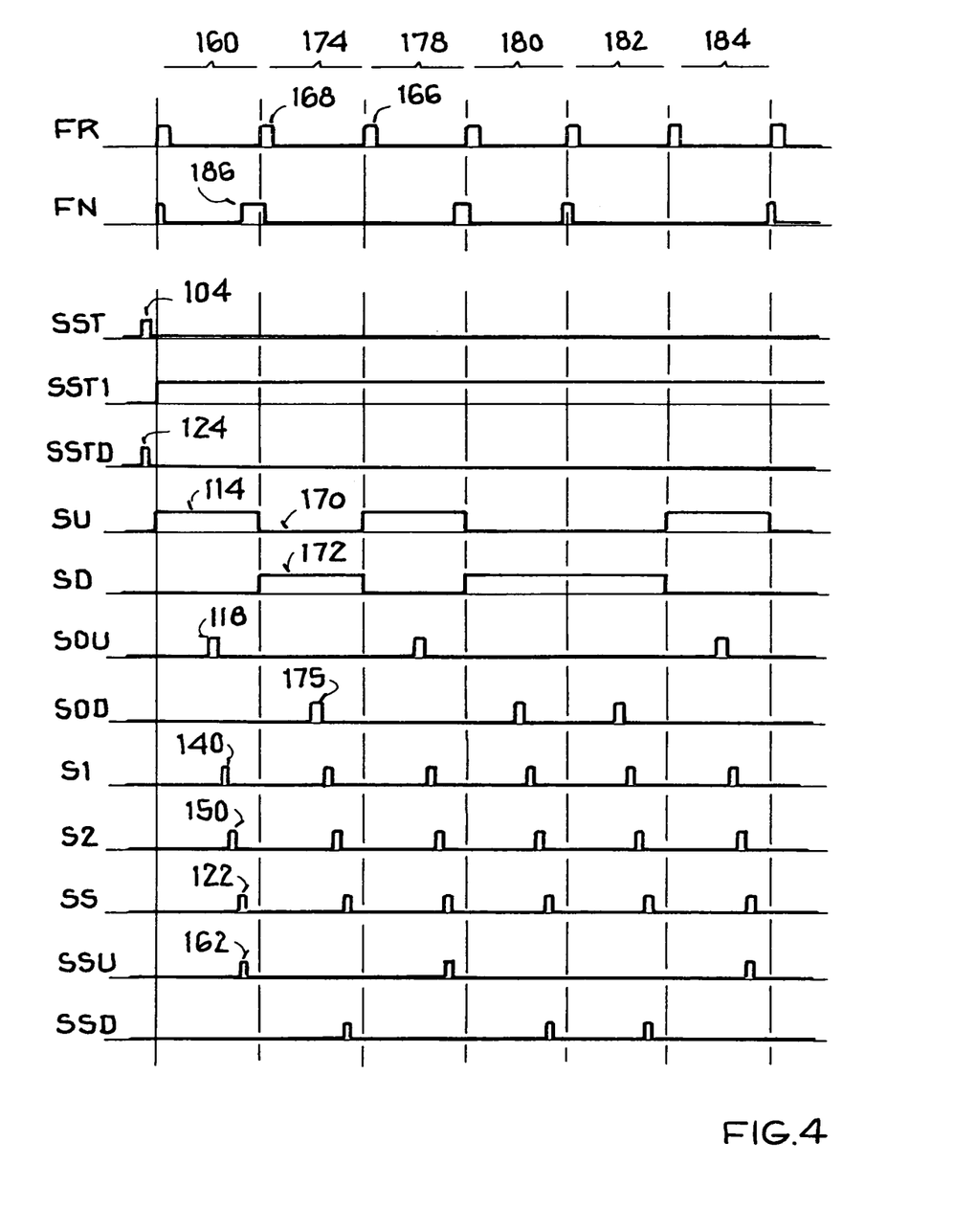
FIG. 4 illustrates computer output pulse signals or sequences of such signals as a function of time and as provided by computer outputs shown in FIG. 3.

The function of the analog circuit 42 will now be explained with reference to FIG. 3 and to the control signals illustrated as functions of time in FIG. 4. The switched or switchable capacitor concept SC is realized in the analog circuit 42. This switched or switchable capacitor concept is quite suitable for embodiment by CMOS technologies. FIG. 4 shows clock or cycle patterns for the sequence control of the method according to the invention. The following switching cycle or clock impulses or switching pulse trains SST, SST1, SSTD, SU, SD, SOU, SOD, S1, S2, SS, SSU and SSD are shown in FIGS. 3 and 4. These impulses or impulse train trigger various CMOS transistor switches. A high logic signal level closes the corresponding switch while a low logic signal level opens the corresponding switch. Additionally, FIG. 4 shows a first clock signal FR and a second clock signal FN. The clock signal FR indicates the completion of a counting period by the reference frequency divider 18. The clock signal FN indicates the completion of a counting period of the main frequency divider 14.

A starting value for the control voltage VC of the oscillator 12 is generated respectively by the first voltage divider 74 and by the second voltage divider 78. This generation of a starting voltage value is accomplished by suitably operating the switches 94, 95, 96, 98, 100 and 102. A short duration closing of the switches 94 and 95 by the SST-impulse 104 discharges the capacitors 106, 108, 110 and 112, please see FIG. 4. Subsequently, the switches 94 and 95 are controlled by the signal SST1 which closes these switches continuously, thereby charging the capacitors 106, 108, 110 and 112 of the voltage dividers 74 and 76. These voltage dividers are connected between a supply voltage 114 and ground potential 116. As a result, a voltage VCU appears at the circuit node 58 and a voltage VCD appears at the circuit node 60. At the beginning these voltages VCU and VCD are equal to each other. The impulse 114 of the signal SU then closes the switch 62 thereby applying the above defined starting value (VCU=VCD) to the circuit node 41.

By closing the switch 116 through the SOU pulse 118, the actual value of the control voltage VC which is the current voltage VC(t) is transmitted by the third voltage follower or amplifier 82 to the node 66. During the following iteration step, this voltage is transmitted through the switch 120 which is closed by the SS pulse 122, to the fourth voltage follower or amplifier 84 to the node 68 where this voltage now is a past value VC(t−1). However, during the first iteration step the potential at the node 68 is defined by the voltage between the potentials VT and VL. This voltage is applied to the node 68 by closing the switch 126 with the SSTD pulse 124. As a result this voltage passes to the node 68 through the fourth voltage follower or amplifier 84. This voltage serves as a past voltage value VC(t−1) for a first calculation of a possible future value VC(t+1) of the control voltage VC(t). The voltages VT and VL define the working range of the analog circuit 42. Normally these voltages are somewhat smaller than the supply voltage because the working range of the analog circuit 42 does not encompass the entire range of the supply voltage.

The two SC-amplifiers 86 and 90 subsequently provide different values of the follower control voltage VC(t+1) to the nodes 70 and 72. In this connection the follower or future voltage VC(t+1) at the inverting SC-amplifier 86 is calculated in accordance with Equation I as follows:

$$VC(t+1)=VC(t)+((VC(t)=VC(t-1))/a \qquad \text{(Equation I)}.$$

Similarly, the voltage VC(t+1) at the non-inverting SC-amplifier 90 is calculated in accordance with Equation II as follows:

$$VC(t+1)=VC(t)-((VC(t)-VC(t-1))/a \qquad \text{(Equation II)}.$$

Thus, the divisor "a" determines the voltage step width (increment or decrement) of a change of the control voltage. This voltage step is determined by the ratio of the capacitors 92 to 127 and 88 to 128, respectively. In order to produce possible future follow-up values VCT(t+1) according to the Equations I and II, the switches 129, 130, 132, 134, 136 and 138 are operated by an S1-pulse 140 while the switches 142, 144, 146 and 148 are operated by the S2-pulse 150.

During the phase of the S1-pulse 140, that pulse serves as a reset phase of the inverting SC-amplifier 86. Following a switch-over to the S2-pulse 150, first the voltage VC(t−1) is transmitted through the capacitor 88 to the sliding input node 152 of the operational amplifier 154. The operational amplifier 154 controls, in closed loop fashion, its output voltage VC(t+1) in such a way that at the input node 152 again the voltage VCT occurs.

Following the S2-pulse 150 the capacitor 88 is charged with a charge Q_11=(VC(t−1)−VC(t))/C11, whereby C11 is the capacity of the capacitor 88. Therefore, the capacitor 128 must be charged with the charge Q12=−Q11. This is so because the total charge at the insulated sliding input node 152 does not change. Thus, the following condition applies $$(VC(t+1)-VC(t))/C12=-(VC(t-1)-VC(t))/C11. \qquad \text{Equation III}.$$

This Equation corresponds to Equation I.

The capacitor 92 of the non-inverting SC-amplifier 90 is charged when the switches 134 and 136 are closed, that is during the S1-pulse 144. This charge corresponds to Q21=(VC(t−1)−VC(t))/C21, whereby C21 is the capacity of the capacitor 92. Following opening of the switches 134 and 136 and closing of the switches 146 and 148 by the S2-pulse 150 the charged capacitor 92 is connected with a reversed polarity to the input of the operational amplifier 158. Thus, the operational amplifier 158 functions as an inverter. By inverting the polarity of the capacitor 92, one realizes overall a non-inverting SC-amplifier 90 which provides a voltage VC(t+1) in accordance with Equation II. Thus, a voltage increment VC+δ and at the node 72 a voltage decrement VC−δ are produced. The increment and the decrement are produced under the boundary conditions of a first counting period 160 shown in FIG. 4. The SSU pulse 162 closes the switch 164 thereby applying the voltage increment VC+δ to the node 58. Correspondingly, the SSU-pulse 162 closes the switch 166 to thereby apply the voltage decrement VC−δ to the node 60.

It is a particular advantage that the voltage increment VC+δ and voltage decrement VC−δ are made available already during the first counting period 160. The end of this first counting period is indicated by an FR pulse 168 which is supplied by the reference frequency divider 118 to the computer 40. Thus, at the end of the first counting period of the reference frequency divider 80 both possible voltage steps are made available for the oscillator 12. As an advantageous consequence the charging pump 22 can then be activated directly following a comparing. This feature is particularly important when the switch-over and the new settling time of the phase locked loop 10 are to happen as rapidly as possible.

In the second counting period 174, the main frequency divider 14 has already completed its counting period earlier and thereby provided the FR-pulse 166. This constellation shows that the frequency of the oscillator 12 is too high. As a result, the computer 40 switches a gap 170 into the SU-signal and provides an SD-pulse 172 for a further counting period 174. The SD-pulse 172 closes the switch 64, thereby determining the oscillator control voltage for the next counting period. This control voltage is VC−δ=VC_2 which is smaller than the previous control voltage VC whereby the frequency of the oscillator 12 is reduced.

Already during the first counting period 160 the switch 120 is closed thereby transferring the control voltage of the first counting period 160 to the node 68 as a new past control voltage value. Thereafter the switch 176 is closed during the second counting period 174 by an SOD pulse 175. As a result, the now actual or current control voltage is transmitted as a basis for the iterative determination of following control voltages through the third voltage follower or amplifier 82 to the node 66.

This sequencing is repeated in further counting periods 178, 180, 182, and 184 with changes which are caused by the signals shown in FIG. 4. While time relationship or position of the FR-pulse 168 and of the FN-pulse 166 at the end of the first counting period 160 showed a starting value VC_1 as being too high, the characteristics of the following FR-pulse and the missing FN-pulse now indicated at the end of the following counting period 172 a control voltage VC_2 that is too low. In this case the FN pulse does not occur because the earlier occurrence of the FR pulse immediately triggered a new counting period 178 with a further increased control voltage VC_3.

Figure 5:
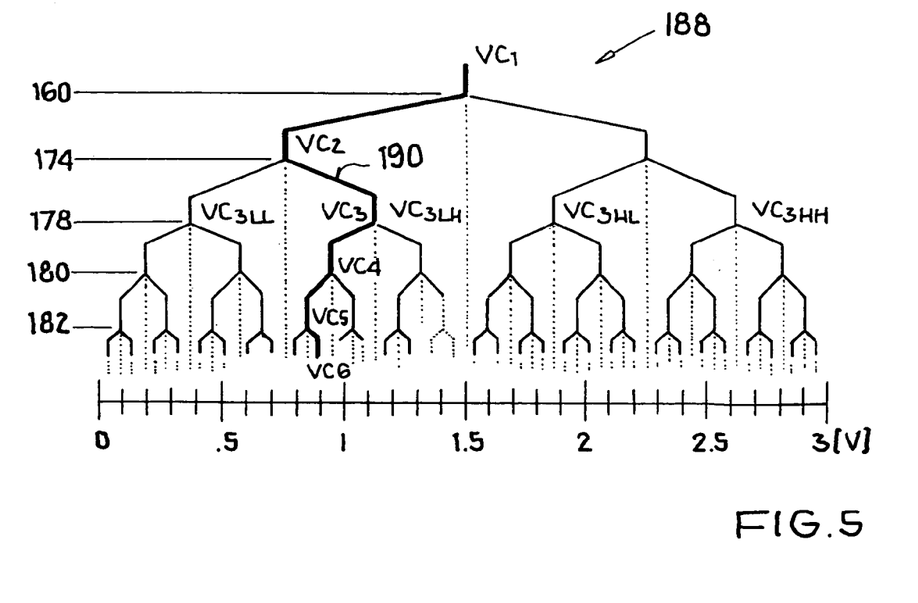
FIG. 5 shows the varying voltage changes or voltage differences as increments or decrements of the oscillator control voltage as produced by the present circuit arrangement for performing the present method.

Subsequently and in analog fashion the control voltage is decremented first to a value VC_4 and then further decremented to a value VC_5 followed by a final incrementing to a value VC_6. Thereby, the voltage step width of the changes, that is the difference between the control voltages VC(n−1) and VC(n), decreases with each iteration step of a new counting period. This is shown in FIG. 5 illustrating a so-called tree 188 of possible variations of the control voltage during the six counting periods 160, 174, 178, 180, 182 and 184. shown in FIG. 4 together with the actually occurring successive variation change 190 of the control voltage VC shown in FIG. 5.

Thus, a control voltage is set, during the first counting step, for example to one half of the supply voltage. Then, a first counting period 160 is started for the two frequency dividers 14 and 18. This results in a decision whether the instantaneous frequency of the oscillator 12 is too high or too low. During the first counting period 160 two new control voltages VC−δ and VC+δ are calculated for the control voltage. The calculation of these new control values uses the starting value VC1 and the difference between the starting value and the limits of the working range of the analog circuit 42. Depending on the output signal of the phase/frequency detector 22, that is whether the actual frequency is too high or too low, one of these two voltages is defined as a new control voltage VC_2 for the oscillator 12 and a second is defined based on the two limit voltages. Thus, a second counting period 174 is started. During the second counting period 174 a combination of the two voltages (VC_3LL and VC_3LH) or (VC_3HL and VC_3HH) is calculated. The output signals FR and FN of the phase/frequency detector 20 then decide which voltage is selected as control voltage for the oscillator 12 for the third comparing period or counting period 178 which is then started as a new counting period. After five counting periods 160, 174, 178, 180, and 182 as shown in FIG. 5, one of the thirty-two possibilities is selected as a control voltage for the sixth counting period 182.

Due to the continuous refinement of the step width by increments or decrements that become smaller for each counting period for the oscillator control voltage, it is assured that the actual control voltage of the loop filter 24 of the settled phase locked loop 10 approximates the selected rated voltage ever better. The precision of the present method is limited only by so-called offset effects of the circuit.

The offset effect of the amplifiers and the size of the charge injection of the CMOS-switches is important for designing the present circuit arrangement. In the example shown in FIG. 5, a voltage resolution of about 50 mV is achieved following a total of six iteration steps. This resolution presumably provides a reasonable limit for the number of iteration steps where a standard CMOS technology is used to form the present circuit.

The above description is based on the premise that the number of iteration steps is programmable. However, the iteration of the present method could also be stopped when the frequency difference of one counting period or the frequency difference of preferably two sequential counting periods fall below a predetermined threshold. This latter embodiment of the invention is optimally realized, in that a suitable logic circuit, for example the computer 40, evaluates the phase shift between the FR-pulses and the FN-pulses.

For the basic circuit according to the invention it is assumed that the counting periods are started only when the charging pump 22 is switched off again following the charging of the capacities or rather the capacitors of the loop filter 24. At that time the frequency of the oscillator 12 is constant during a counting period.

Another modification resides in the possibility to continuously operate the reference frequency divider 18. During normal operation the reference frequency divider 18 is not reprogrammed. However, when the reference frequency divider 18 is running continuously, the loop filter 24 is charged-up at the beginning of a counting period of the reference frequency divider 18. This means that the frequency of the oscillator 12 changes. This inaccuracy can be compensated by a respective reduction of the divisor "a". Thus, it is assured that the output voltage of the circuit 38 always approximates the correct rated voltage for controlling the oscillator 12.

After selecting an oscillator control voltage in accordance with any one of the above described alternate possibilities, the normal closed loop control function of the phase locked loop 10 is activated by operating the switch 44 to connect the loop filter 24 to the oscillator 12.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method for producing an analog control voltage (VC) for a voltage controlled oscillator having one analog control voltage input in a circuit arrangement including a phase locked loop (10), said method comprising the following steps:
   a) setting said control voltage (VC) to a predetermined starting control voltage value (VC_1);
   b) generating respective counting sequences (160, 174, 178, 180, 182, 184) in a main frequency divider (14) and in a reference frequency divider (18) and synchronizing counting beginnings of both said counting sequences, with each other;
   c) determining during an actual counting sequence of said counting sequences, an actual oscillator control voltage (VC(t)); said actual oscillator control voltage being effective during said actual counting sequence;
   d) calculating, based on said actual oscillator control voltage (VC(t)), a first new oscillator control voltage (VC(t+1)) that is larger than said actual oscillator control voltage to provide a first voltage difference;
   e) further calculating, based on said actual oscillator control voltage (VC(t)), a second new oscillator control voltage (VC(t+1)) that is smaller than said actual oscillator control voltage to provide a second voltage difference;
   f) varying said control voltage (VC) in accordance with said first voltage difference in a first direction in response to said reference frequency divider completing a counting sequence prior to said main frequency divider completing a counting sequence; and
   g) further varying said control voltage (VC) in accordance with said second voltage difference in a second direction opposite said first direction in response to said main frequency divider completing a counting sequence prior to said reference frequency divider completing a counting sequence.

2. The method of claim 1, wherein, when said voltage controlled oscillator has a positive working characteristic, said varying step (f) increases said control voltage (VC) and said varying step (g) decreases said control voltage.

3. The method of claim 1, wherein, when said voltage controlled oscillator has a negative working characteristic, said first varying step decreases said control voltage and wherein said second varying step increases said control voltage.

4. The method of claim 1, further comprising repeatedly performing said steps b to g defined in claim 1 and reducing said first and second voltage differences with each repetition.

5. The method of claim 1, wherein, when said voltage controlled oscillator requires a rated supply voltage, said step (a) is performed to set said predetermined starting control voltage value (VC_1) to one half of said rated supply voltage.

6. The method of claim 1, further comprising the step of taking into account in at least one of said calculating steps at least one prior control voltage value (VC(t−1)) that occurred prior to said actual oscillator control voltage (VC(t)).

7. The method of claim 1, further comprising repeating said varying step and said further varying step at least five times prior to switching over to a steady closed loop feedback control of said control voltage.

8. The method of claim 1, further comprising switching over to a steady closed loop feedback control when at least one time duration difference between a termination of one counting sequence of said reference frequency divider and a termination of one counting sequence of said main frequency divider, is smaller than a predetermined time difference voltage threshold value.

9. A circuit arrangement for generating one analog control voltage for a voltage controlled oscillator having one analog control voltage input, said circuit arrangement comprising a phase locked loop (10), an input (28) for setting a starting control voltage, a main frequency divider and a reference frequency divider, a synchronizer for synchronizing a beginning of a counting sequence of said main frequency divider with a beginning of a counting sequence of said reference frequency divider, a control circuit (38) for determining, during a counting sequence an actual oscillator control voltage, a computer (40) for calculating, based on said actual oscillator control voltage, a first new oscillator control voltage that is larger than said actual oscillator control voltage and for calculating a second new oscillator control voltage that is smaller than said actual oscillator control voltage, a first voltage varying circuit for increasing or decreasing said control voltage by a first determined voltage difference per varying step in response to said reference frequency divider completing its counting sequence prior to said main frequency divider completing its counting sequence, and a second voltage varying circuit for decreasing or increasing said control voltage by a second determined voltage difference per varying step in response to said main frequency divider completing its counting sequence prior to said reference frequency divider completing its counting sequence.

10. The circuit arrangement of claim 9, wherein said control circuit (38) includes said computer (40) for controlling at least said first and second voltage varying circuits to repeat said varying and for reducing said first and second determined voltage differences per varying step for each varying repetition.

11. The circuit arrangement of claim 9, wherein said control circuit (38) determines said starting control voltage value at 50% of a rated supply voltage of said voltage controlled oscillator.

12. The circuit arrangement of claim 10, wherein said control circuit (38) determines said control voltage by controlling said first and second voltage varying circuits to perform up to five voltage varying cycles and then switching over to a steady closed loop feedback control of said control voltage.

13. The circuit arrangement of claim 12, wherein said control circuit (38) performs said switching over to said steady closed loop feedback control when at least one time difference between a termination of one counting sequence of said reference frequency divider and a termination of one counting sequence of said main frequency divider, is smaller than a predetermined time difference threshold value.

14. The circuit arrangement of claim 10, wherein said control circuit (38) further comprises an integrated analog circuit (42) including a plurality of switchable capacitors (88, 92), and wherein said computer (40) comprises a sequencing controller (54) including switches (129, 130; 146, 136) for switching said switchable capacitors (88, 92).

15. The circuit arrangement of claim 14, wherein said switches comprise CMOS-transistors for switching said switchable capacitors.

16. The circuit arrangement of claim 10, wherein said computer (40) comprises a plurality of outputs (54) for controlling at least one operation sequence of steps.

17. The circuit arrangement of claim 14, wherein said integrated analog circuit (42) comprises circuit nodes coupled to said switchable capacitors, wherein at least one switchable capacitor pair of said switchable capacitors stores an actual oscillator control voltage value (VC(t)), wherein at least one further switchable capacitor pair of said switchable capacitors stores a prior oscillator control voltage value (VC(t−1)), and wherein at least two switchable capacitor pairs of said switchable capacitors store two estimated or calculated future oscillator control voltage values (VC(t+1)).

18. The circuit arrangement of claim 17, further comprising a switchable capacitor inverting amplifier (86) for providing one of said two future oscillator control voltage values, and a switchable capacitor noninverting amplifier (90) for providing the other of said two future oscillator control voltage values.

19. The circuit arrangement of claim 18, wherein said inverting switchable capacitor amplifier (86) and said noninverting switchable capacitor amplifier (90) estimate or calculate the respective future oscillator control voltage value (VC(t+1)) based on said prior oscillator control voltage value (VC(t−1)) and based on said actual oscillator control voltage value (VC(t)).

20. The circuit arrangement of claim 19, wherein said inverting switchable capacitor amplifier (86) calculates said one future oscillator control voltage value (VC(t+1)) in accordance with a first equation (I) as follows:

$$VC(t+1)=VC(t)+((VC(t)-VC(t-1))/a \qquad \text{(Equation I)}$$

and wherein said noninverting switchable capacitor amplifier (90) calculates said other future oscillator control voltage value in accordance with a second equation (II) as follows:

$$VC(t+1)=VC(t)-((VC(t)-VC(t-1))/a \qquad \text{(Equation II)},$$

wherein said divisor "a" is determined as a ratio of two capacities of said capacitors, and wherein said divisor "a" determines said voltage difference per voltage varying step.

* * * * *